(12) United States Patent
Lee et al.

(10) Patent No.: US 11,296,183 B2
(45) Date of Patent: Apr. 5, 2022

(54) DISPLAY PANEL INCLUDING COMPENSATION SEMICONDUCTOR LAYER DISPOSED CLOSER TO DRIVING SEMICONDUCTOR LAYER THAN SCAN LINE

(71) Applicant: Samsung Display Co., Ltd., Yongin-Si (KR)

(72) Inventors: Soyoung Lee, Yongin-si (KR); Chulkyu Kang, Yongin-si (KR); Sunghwan Kim, Yongin-si (KR); Hyunchol Bang, Yongin-si (KR); Soohee Oh, Yongin-si (KR); Dongsun Lee, Yongin-si (KR)

(73) Assignee: Samsung Display Co., Ltd.

(*) Notice: Subject to any disclaimer, the term of this patent is extended or adjusted under 35 U.S.C. 154(b) by 52 days.

(21) Appl. No.: 16/988,764

(22) Filed: Aug. 10, 2020

(65) Prior Publication Data

US 2021/0265456 A1     Aug. 26, 2021

(30) Foreign Application Priority Data

Feb. 24, 2020   (KR) ................ 10-2020-0022372

(51) Int. Cl.
*H01L 27/32*     (2006.01)
*H01L 27/12*     (2006.01)

(52) U.S. Cl.
CPC ...... *H01L 27/3279* (2013.01); *H01L 27/3262* (2013.01); *H01L 27/1214* (2013.01)

(58) Field of Classification Search
CPC ................ H01L 27/3279; H01L 27/3262

USPC ........................................... 257/40
See application file for complete search history.

(56) References Cited

U.S. PATENT DOCUMENTS

| 8,928,597 B2 | 1/2015 | Jang |
| 9,704,938 B2 | 7/2017 | Son et al. |
| 10,043,451 B2 | 8/2018 | Lee et al. |
| 2010/0182303 A1 | 7/2010 | Takasugi et al. |

(Continued)

FOREIGN PATENT DOCUMENTS

| KR | 10-1103615 B1 | 1/2012 |
| KR | 10-2016-0086503 A | 7/2016 |

(Continued)

*Primary Examiner* — Matthew E. Gordon
(74) *Attorney, Agent, or Firm* — Innovation Counsel LLP

(57) ABSTRACT

The present disclosure provides a display panel. In order to reduce a parasitic capacitance that may occur between a data line and a semiconductor layer and a crosstalk caused by the parasitic capacitance, a display panel includes a substrate, a driving thin film transistor on the substrate, including a driving semiconductor layer and a driving gate electrode, a compensation thin film transistor on the substrate, including a compensation semiconductor layer and a compensation gate electrode, a node connection line electrically connecting the driving thin film transistor to the compensation thin film transistor, a scan line extending in a first direction on the substrate, and a gate connection line electrically connected to the scan line, which includes the compensation gate electrode, wherein the compensation semiconductor layer is closer to the driving semiconductor layer than the scan line when viewed on a plane.

20 Claims, 14 Drawing Sheets

(56) References Cited

U.S. PATENT DOCUMENTS

| | | | | |
|---|---|---|---|---|
| 2016/0204182 A1* | 7/2016 | Son | .................... | H01L 27/3276 |
| | | | | 257/40 |
| 2017/0005156 A1* | 1/2017 | Kim | .................... | H01L 27/3262 |
| 2017/0040408 A1* | 2/2017 | Choi | .................... | H01L 27/1225 |
| 2018/0082630 A1* | 3/2018 | Kim | .................... | H01L 27/3223 |
| 2018/0151650 A1* | 5/2018 | Ha | .................... | H01L 27/3262 |

FOREIGN PATENT DOCUMENTS

| | | |
|---|---|---|
| KR | 10-2016-0129186 A | 11/2016 |
| KR | 10-1972574 B1 | 4/2019 |

\* cited by examiner

DISPLAY PANEL INCLUDING COMPENSATION SEMICONDUCTOR LAYER DISPOSED CLOSER TO DRIVING SEMICONDUCTOR LAYER THAN SCAN LINE

CROSS-REFERENCE TO RELATED APPLICATION

This application claims the benefit of Korean Patent Application No. 10-2020-0022372, filed on Feb. 24, 2020, in the Korean Intellectual Property Office, the disclosure of which is incorporated herein in its entirety by reference.

BACKGROUND

1. Field

The present disclosure relates to a display panel, and more particularly, to a display panel for realizing images of high image quality and high resolution.

2. Description of Related Art

A display apparatus displays data visually. Such a display apparatus includes a display area and a peripheral area. In a display area, scan lines and data lines are arranged being insulated from each other, and a plurality of pixels are provided. Also, the display area includes a pixel circuit including a thin film transistor corresponding to each of the pixels and a storage capacitor. The peripheral area may include various lines for transferring electrical signals to the pixel circuit in the display area, a scan driver, a data driver, a controller, etc.

Display apparatuses have been used for various purposes. Also, because the thickness and weight of the display apparatuses have been reduced, the utilization range of the display apparatuses has increased. Designs of a pixel circuit have been diversified for implementing high quality and high resolution of the display apparatus.

SUMMARY

One or more embodiments provide a display panel capable of realizing high quality and high resolution images.

Additional aspects will be set forth in part in the description which follows and, in part, will be apparent from the description, or may be learned by practice of the presented embodiments of the disclosure.

According to an embodiment, a display panel comprises a substrate, a driving thin film transistor disposed on the substrate, the driving thin film transistor including a driving semiconductor layer and a driving gate electrode, a compensation thin film transistor disposed on the substrate, the compensation thin film transistor including a compensation semiconductor layer and a compensation gate electrode, a node connection line electrically connecting the driving thin film transistor to the compensation thin film transistor, a scan line extending in a first direction on the substrate, and a gate connection line electrically connected to the scan line, the gate connection line including the compensation gate electrode, wherein the compensation semiconductor layer is disposed closer to the driving semiconductor layer than the scan line when viewed on a plane.

The display panel may further include a switching thin film transistor disposed on the substrate, the switching thin film transistor including a switching semiconductor layer and a switching gate electrode, wherein the gate connection line may further include the switching gate electrode.

A resistivity value of the scan line may be less than a resistivity value of the driving gate electrode.

The display panel may further include an insulating layer disposed between the gate connection line and the scan line, wherein the scan line may be connected to the gate connection line via a contact hole in the insulating layer.

The gate connection line and the scan line may include different materials from each other.

The gate connection line may include a first portion extending in a second direction that crosses the first direction, and a second portion extending from the first portion in the first direction.

The compensation semiconductor layer may include a first portion and a second portion which extend in different directions from each other from a bending point, the first portion of the compensation semiconductor layer may overlap the first portion of the gate connection line, and the second portion of the compensation semiconductor layer may overlap the second portion of the gate connection line.

The gate connection line and the compensation semiconductor layer overlapping each other may configure a square closed loop when viewed on a plane.

The node connection line may extend in the second direction crossing the first direction and cross the second portion of the gate connection line.

The driving semiconductor layer may be curved to form a long channel length with a narrow space.

According to another embodiment, a display panel comprises a scan line extending in a first direction, a data line extending in a second direction that crosses the first direction, a switching thin film transistor electrically connected to the scan line and the data line, the switching thin film transistor including a switching semiconductor layer and a switching gate electrode, a driving thin film transistor electrically connected to the switching thin film transistor, the driving thin film transistor including a driving semiconductor layer and a driving gate electrode, a compensation thin film transistor including a compensation semiconductor layer and a compensation gate electrode that are arranged with respect to a first gate insulating layer therebetween, and a gate connection line electrically connected to the scan line, the gate connection line including the compensation gate electrode, wherein the compensation semiconductor layer includes a first portion extending in the first direction, and a second portion bent from the first portion and extending in a direction away from the driving thin film transistor.

The compensation semiconductor layer may be closer to the driving semiconductor layer than the scan line when viewed on a plane.

The gate connection line further may include a first portion extending in the second direction and a second portion extending in the first direction, the first portion of the gate connection line may overlap the first portion of the compensation semiconductor layer, and the second portion of the gate connection line may overlap the second portion of the compensation semiconductor layer.

The gate connection line may further include the switching gate electrode.

The display panel may further include a second gate insulating layer and an interlayer insulating layer disposed between the gate connection line and the scan line, and the scan line may be connected to the gate connection line via a first contact hole penetrating through the interlayer insulating layer and the second gate insulating layer.

The gate connection line may include a material different from a material in the scan line.

The display panel may further include a second gate insulating layer and an interlayer insulating layer disposed between the gate connection line and the scan line, and a node connection line electrically connecting the driving thin film transistor to the compensation thin film transistor, wherein one end portion of the node connection line may be connected to the driving gate electrode via a second contact hole penetrating through the interlayer insulating layer and the second gate insulating layer, and the other end portion of the node connection line may be connected to the compensation semiconductor layer via a third contact hole penetrating through the interlayer insulating layer, the second gate insulating layer, and the first gate insulating layer.

The node connection line may extend in the second direction and cross the second portion of the gate connection line.

The node connection line may include a material that is equal to a material in the scan line.

The display panel may include an emission control thin film transistor electrically connected to the driving thin film transistor, the emission control thin film transistor including an emission control semiconductor layer and an emission control gate electrode, and an organic light-emitting diode electrically connected to the emission control thin film transistor.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
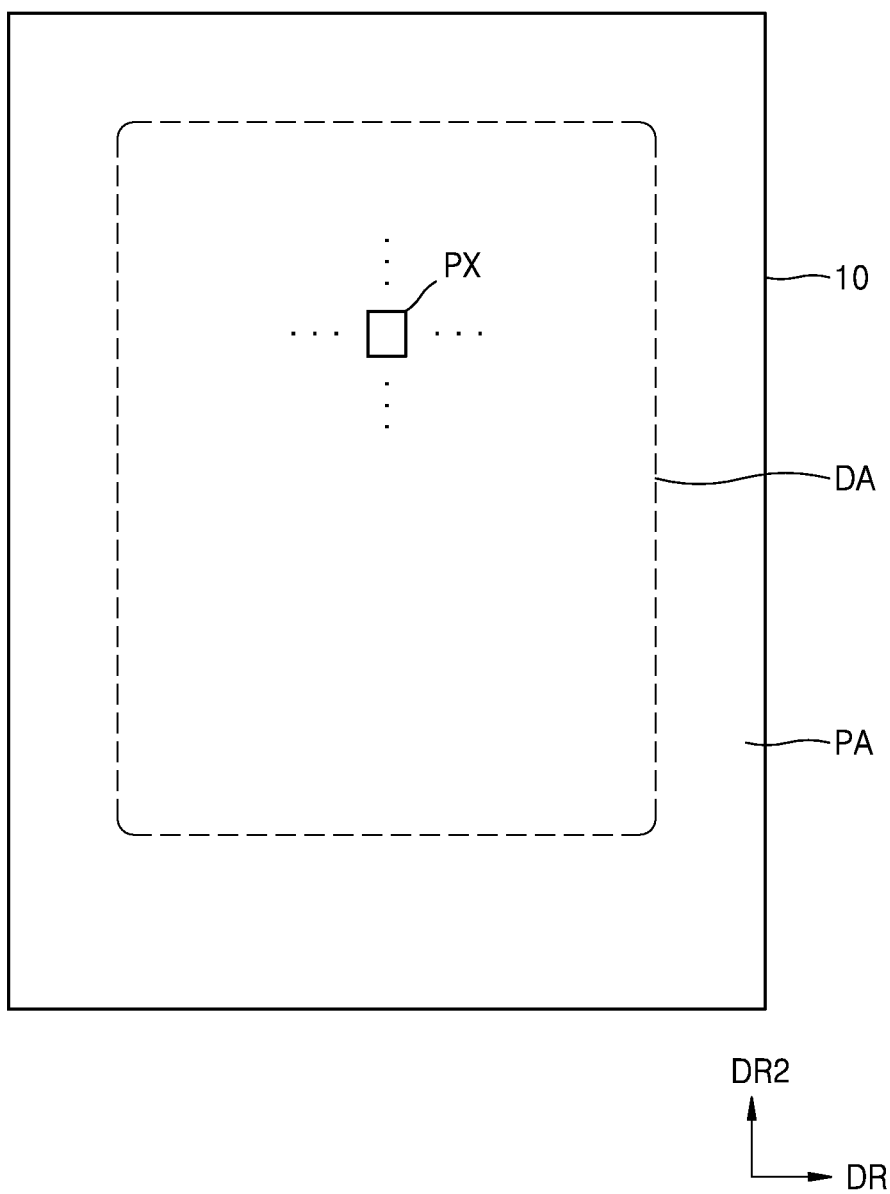
FIG. 1 is a top plan view of a display panel according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a top plan view of a display panel 10 according to an embodiment.

Referring to FIG. 1, the display panel 10 may include a display area DA and a peripheral area PA disposed on outside of the display area DA. The display panel 10 may provide images via arrays of a plurality of pixels PX that are two-dimensionally arranged in the display area DA. The peripheral area PA does not provide images and may partially or entirely surround the display area DA. Drivers for providing electrical signals or electric power to the pixels PX may be provided in the peripheral area PA. The peripheral area PA may include a pad that is a region to which an electronic device and a printed circuit board may be electrically connected.

Hereinafter, the display panel 10 includes an organic light-emitting diode OLED as a display element, but the display panel 10 of the embodiment is not limited. In another embodiment, the display panel 10 may include an inorganic light-emitting display (or an inorganic EL display apparatus) including an inorganic material such as a micro LED, or a quantum dot light-emitting display apparatus. For example, an emission layer of a display element included in the display panel 10 may include an organic material, an inorganic material, quantum dots, an organic material and quantum dots, or an inorganic material and quantum dots.

Figure 2:
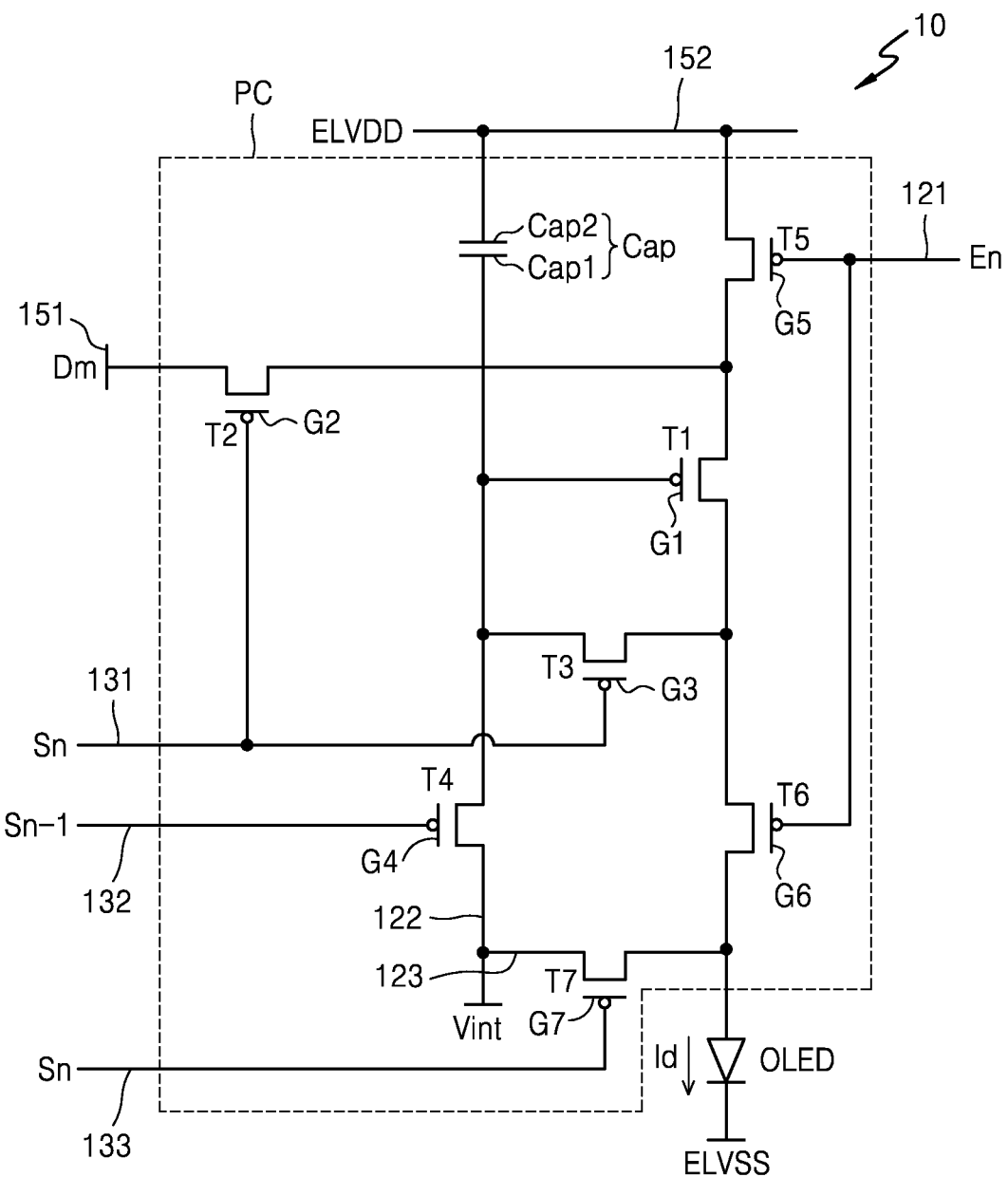
FIG. 2 is an equivalent circuit diagram of a pixel circuit included in a display panel according to an embodiment.

FIG. 2 is an equivalent circuit diagram of a pixel circuit PC included in the display panel 10 according to an embodiment.

Referring to FIG. 2, the display panel 10 includes the pixel circuit PC including signal lines 121, 131, 132, 133, and 151, a plurality of thin film transistors T1, T2, T3, T4, T5, T6, and T7 connected to the signal lines, a storage capacitor Cap, first and second initialization voltage lines 122 and 123, and a driving voltage line 152. In addition, the display panel 10 may include an organic light-emitting diode OLED as a light-emitting element, wherein the organic light-emitting diode OLED emits light by receiving a driving voltage through the pixel circuit PC.

In FIG. 2, each pixel circuit PC includes the signal lines 121, 131, 132, 133, and 151, the first and second initialization voltage lines 122 and 123, and the driving voltage line 152, but one or more embodiments are not limited. In another embodiment, at least one of the signal lines 121, 131, 132, 133, and 151, and/or the first and second initialization voltage lines 122 and 123 may be shared by neighboring pixel circuits PC.

The pixel circuit PC may include the plurality of thin film transistors and the storage capacitor. In an embodiment, the thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7 as shown in FIG. 2.

The signal lines include a scan line 131 for transferring a scan signal Sn, a previous scan line 132 for transferring a previous scan signal Sn-1 to the first initialization thin film transistor T4, a next scan line 133 for transferring a post scan signal Sn+1 to the second initialization thin film transistor T7, an emission control line 121 for transferring an emission control signal En to the operation control thin film transistor T5 and the emission control thin film transistor T6, and a data line 151 crossing the scan line 131 and for transferring a data signal Dm. The driving voltage line 152 may be configured to transfer a driving voltage ELVDD to the driving thin-film transistor T1, and the first and second initialization voltage lines 122 and 123 may be configured to transfer an initialization voltage Vint for initializing the driving thin film transistor T1 and the pixel electrode.

A driving gate electrode G1 of the driving thin film transistor T1 is connected to an electrode of the storage capacitor Cap, one of a source electrode and a drain electrode of the driving thin film transistor T1 is connected to the driving voltage line 152 via the operation control thin film transistor T5, and the other of the source electrode and the drain electrode of the driving thin film transistor T1 is electrically connected to a pixel electrode of the organic light-emitting diode OLED via the emission control thin film transistor T6. The driving thin film transistor T1 receives a data signal Dm according to a switching operation of the switching thin film transistor T2 and supplies a driving current Id to the organic light-emitting diode OLED.

A switching gate electrode G2 of the switching thin film transistor T2 is connected to the scan line 131, one of a source electrode and a drain electrode of the switching thin film transistor T2 is connected to the data line 151, and the remaining source electrode or the drain electrode of the switching thin film transistor T2 is connected to the driving thin film transistor T1 and at the same time connected to the driving voltage line 152 via the operation control thin film transistor T5. The switching thin film transistor T2 is turned on according to the scan signal Sn transmitted via the scan line 131 to perform a switching operation, in which the data signal Dm transferred to the data line 151 is transferred to the driving thin film transistor T1.

A compensation gate electrode G3 of the compensation thin film transistor T3 is connected to the scan line 131, one of a source electrode and a drain electrode of the compensation thin film transistor T3 is connected to the driving thin film transistor T1 and at the same time connected to a pixel electrode of the organic light-emitting diode OLED via the emission control thin film transistor T6, and the other of the source electrode and the drain electrode of the compensation thin film transistor T3 is connected to the electrode of the storage capacitor Cap, the first initialization thin film transistor T4, and the driving thin film transistor T1. The compensation thin film transistor T3 is turned on according to the scan signal Sn transferred through the scan line 131 to electrically connect the gate electrode G1 of the driving thin film transistor T1 to one of the source electrode and the drain electrode (e.g., the drain electrode) of the driving thin film transistor T1 to each other to diode-connect the driving thin film transistor T1.

A first initialization gate electrode G4 of the first initialization thin film transistor T4 is connected to the previous scan line 132, one of a source electrode and a drain electrode of the first initialization thin film transistor T4 is connected to the first initialization voltage line 122, and the other of the source electrode and the drain electrode of the first initialization thin film transistor T4 is connected to the electrode of the storage capacitor Cap, the compensation thin film transistor T3, and the driving thin film transistor T1. The first initialization thin film transistor T4 is turned on according to a previous scan signal Sn-1 transferred through the previous scan line 132 to transfer the initialization voltage Vint to the driving gate electrode G1 of the driving thin film transistor T1 and perform an initialization operation for initializing a voltage at the driving gate electrode G1.

An operation control gate electrode G5 of the operation control thin film transistor T5 is connected to an emission control line 121, one of a source electrode and a drain electrode of the operation control thin film transistor T5 is connected to the driving voltage line 152, and the other of the source electrode and the drain electrode of the operation control thin film transistor T5 is connected to the driving thin film transistor T1 and the switching thin film transistor T2.

An emission control gate electrode G6 of the emission control thin film transistor T6 is connected to the emission control line 121, one of a source electrode and a drain electrode of the emission control thin film transistor T6 is connected to the driving thin film transistor T1 and a compensation source electrode of the compensation thin film transistor T3, and the other of the source electrode and the drain electrode of the emission control thin film transistor T6 is electrically connected to the second initialization thin film transistor T7 and the pixel electrode of the organic light-emitting diode OLED.

The operation control thin film transistor T5 and the emission control thin film transistor T6 are simultaneously turned on according to an emission control signal En transferred through the emission control line 121 to transfer a driving voltage ELVDD to the organic light-emitting diode OLED and to allow a driving current Id to flow in the organic light-emitting diode OLED.

A second initialization gate electrode G7 of the second initialization thin film transistor T7 may be connected to the next scan line 133 of the pixel PX in a next row of the corresponding pixel PX. Also, one of the source electrode and the drain electrode of the second initialization thin film transistor T7 is connected to the emission control thin film transistor T6 and the pixel electrode of the organic light-emitting diode OLED, and the other between the source electrode and the drain electrode of the second initialization thin film transistor T7 is connected to the second initialization voltage line 123.

In addition, the scan line 131 and the next scan line 133 are electrically connected each other so that the same scan signal Sn may be applied. Therefore, the second initialization thin film transistor T7 is turned on according to the scan signal Sn transferred through the next scan line 133 and performs an operation of initializing the pixel electrode of the organic light-emitting diode OLED.

In another example, the first initialization thin film transistor T4 and the second initialization thin film transistor T7 may be connected together to the previous scan line 132.

One electrode of the storage capacitor Cap is connected to the driving voltage line 152, and one electrode of the organic light-emitting diode OLED is connected to a common voltage ELVSS. Accordingly, the organic light-emitting diode OLED emits light by receiving the driving current Id from the driving thin film transistor T1 to display images.

FIG. 2 shows that the pixel circuit PC includes seven thin film transistors T1, T2, T3, T4, T5, T6, and T7 and one storage capacitor Cap, but one or more embodiments are not limited. The number of the thin film transistors and the number of the storage capacitor may vary depending on a design of the pixel circuit PC.

Figure 3:
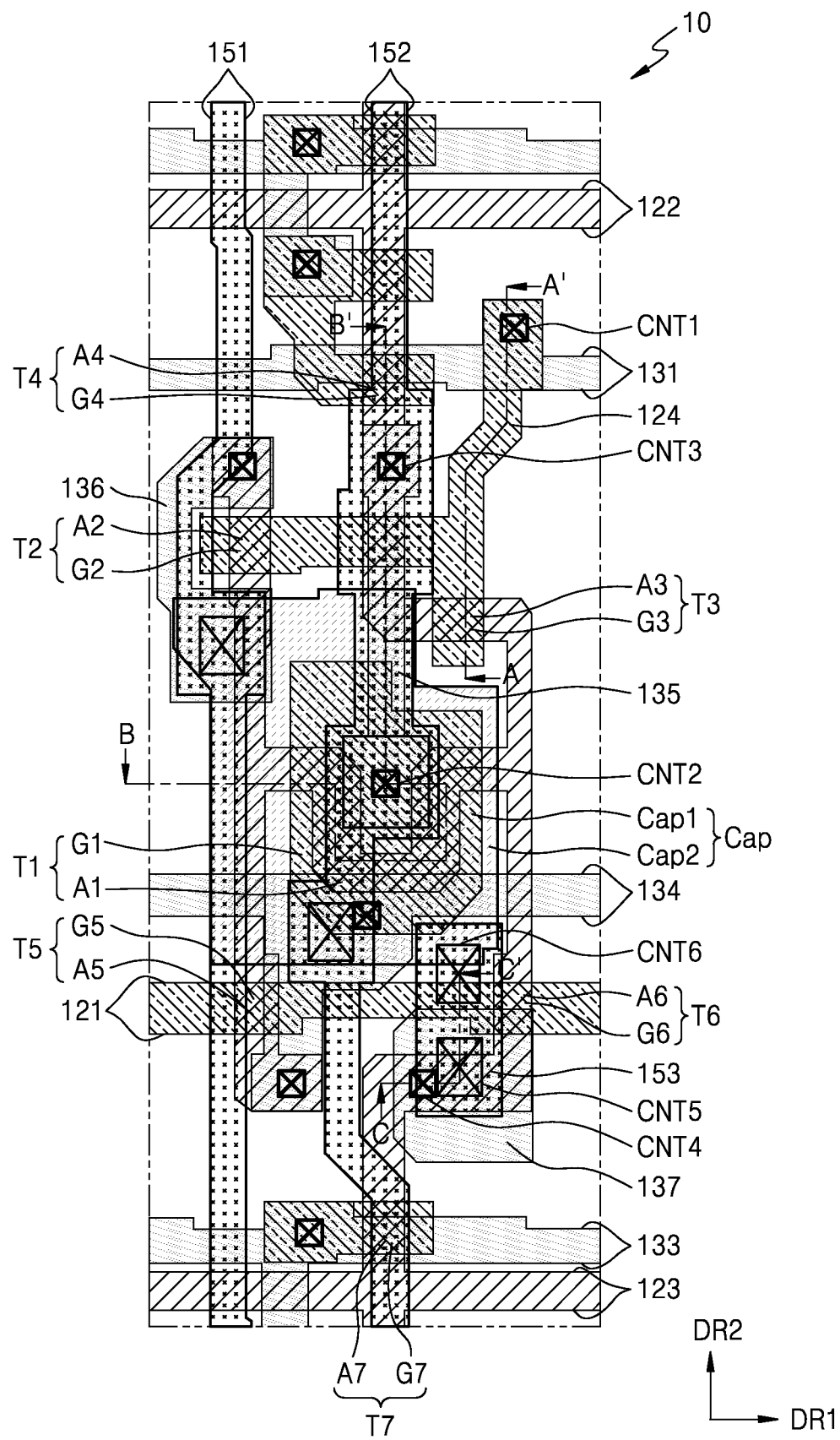
FIG. 3 is an arrangement diagram showing locations of electrical components such as a plurality of thin film transistors and capacitor included in a pixel circuit according to an embodiment.

FIG. 3 is an arrangement diagram showing locations electrical components such as a plurality of thin film transistors and capacitor included in a pixel circuit according to an embodiment, and FIGS. 4, 5, 6, 7, and 8 are arrangement diagrams showing configurations electrical components such as the plurality of thin film transistors and the capacitor shown in FIG. 3 for each layer.

The layout shown in FIG. 3 is a layout of one pixel circuit, and pixel circuits having the same/similar configurations may be upper, below, left, and right sides of the one pixel circuit. FIGS. 4, 5, 6, 7, and 8 show arrangement of wirings at the same layer or a semiconductor layer and insulating layers may be provided among the layered structures shown in FIGS. 4, 5, 6, 7, and 8.

Figure 4:
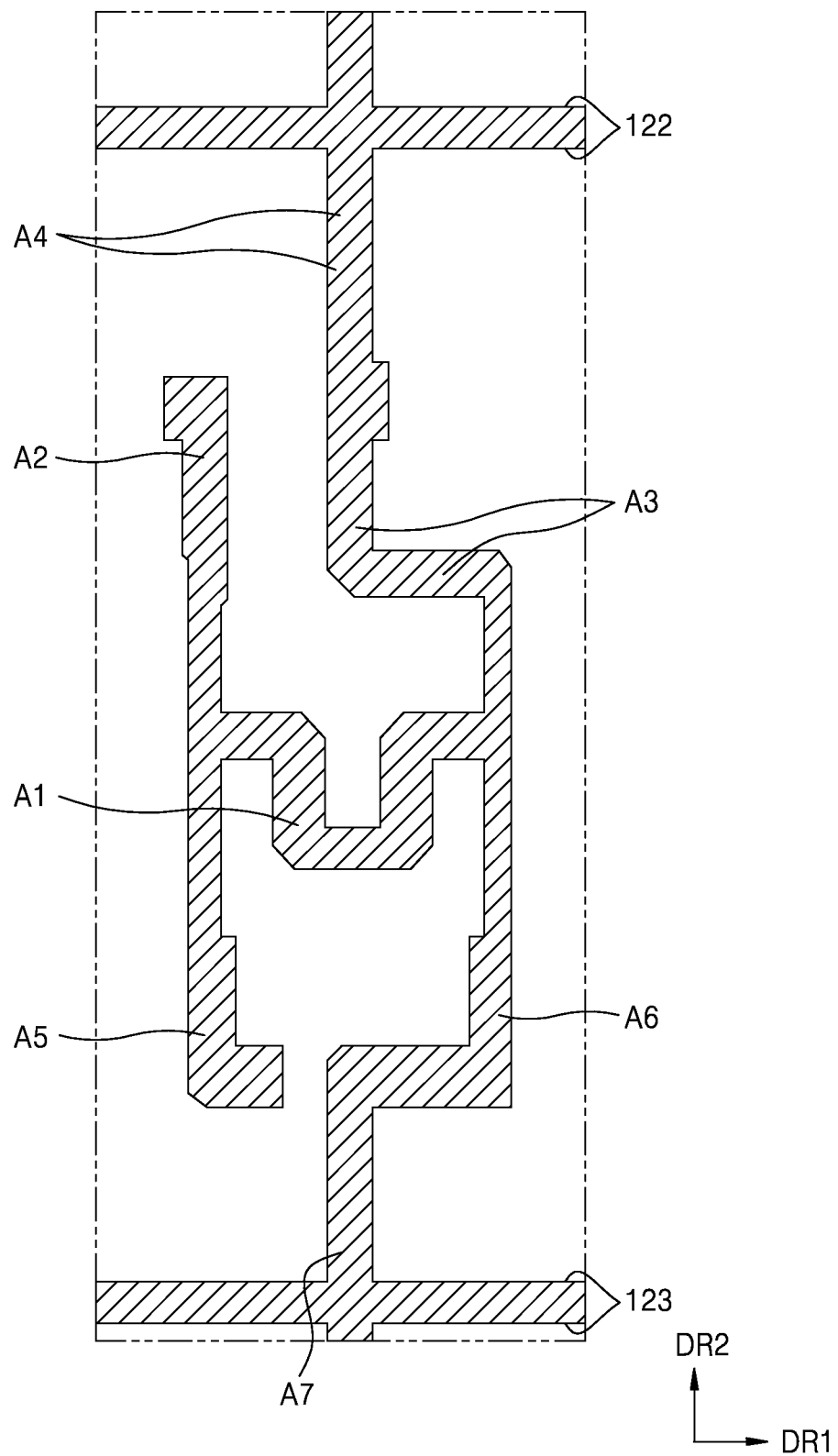
FIGS. 4, 5, 6, 7, and 8 are arrangement diagrams showing configurations of electrical components such as the plurality of thin film transistors and the capacitor shown in FIG. 3 for each of layers.
Figure 5:
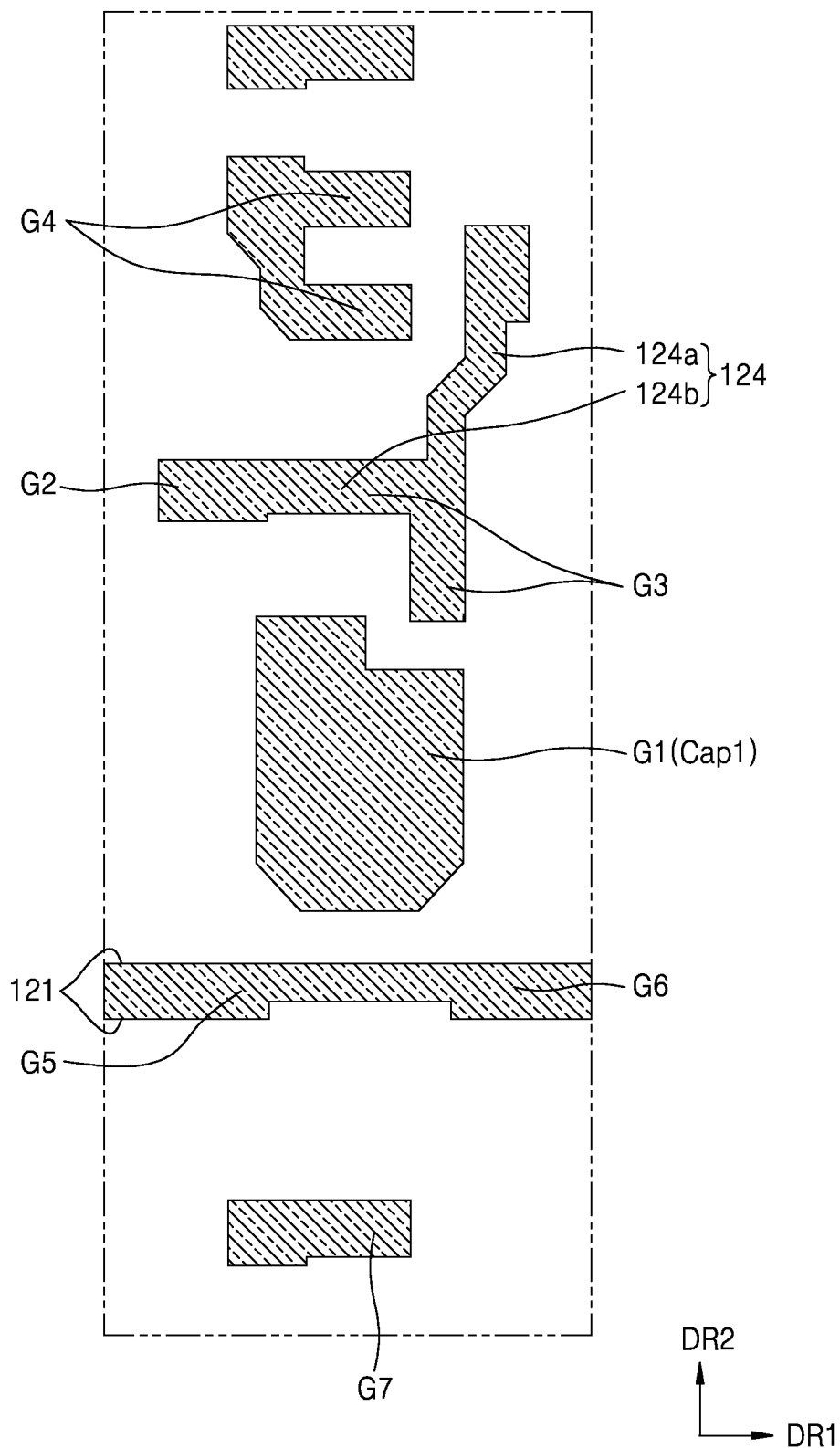
Figure 6:
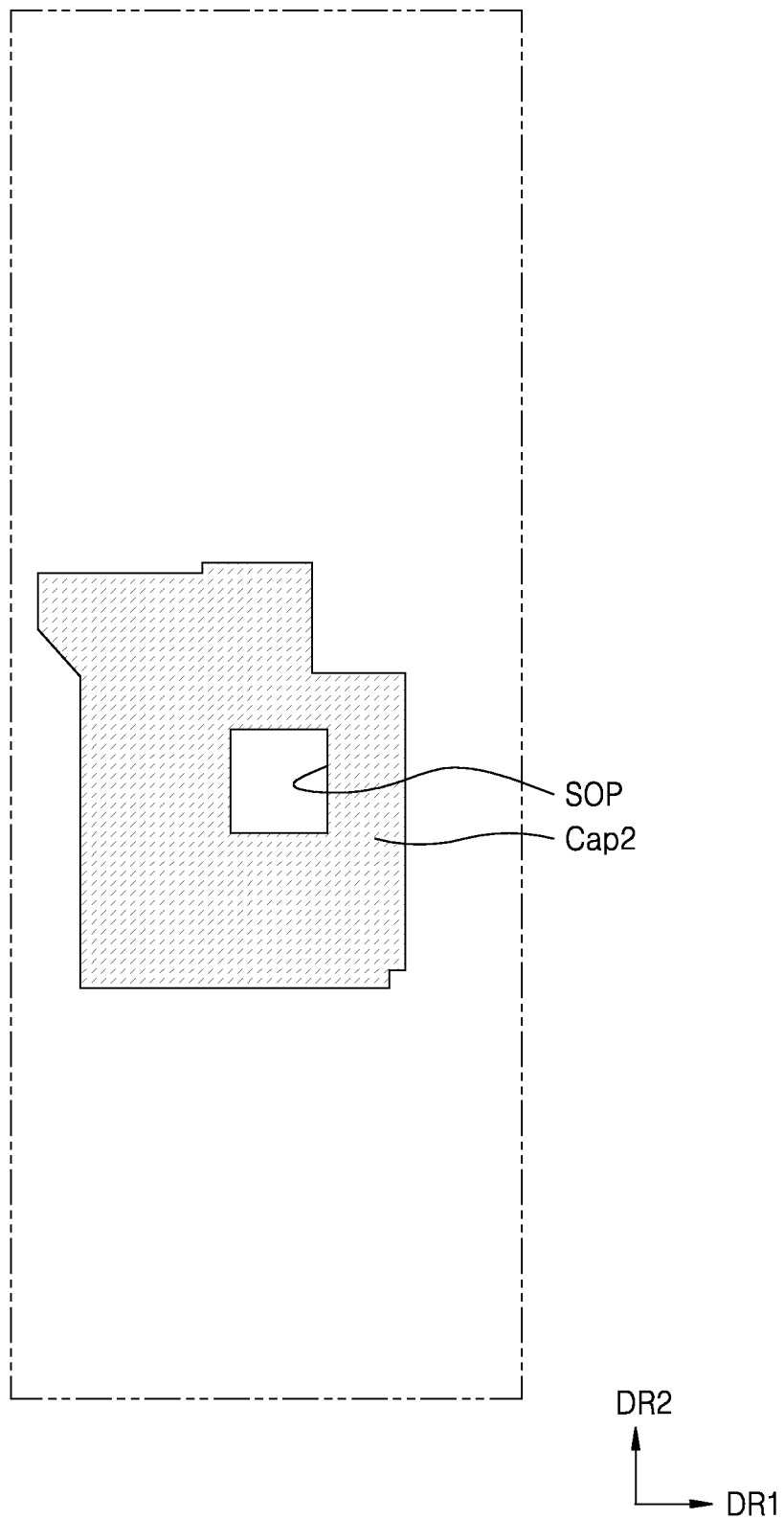
Figure 7:
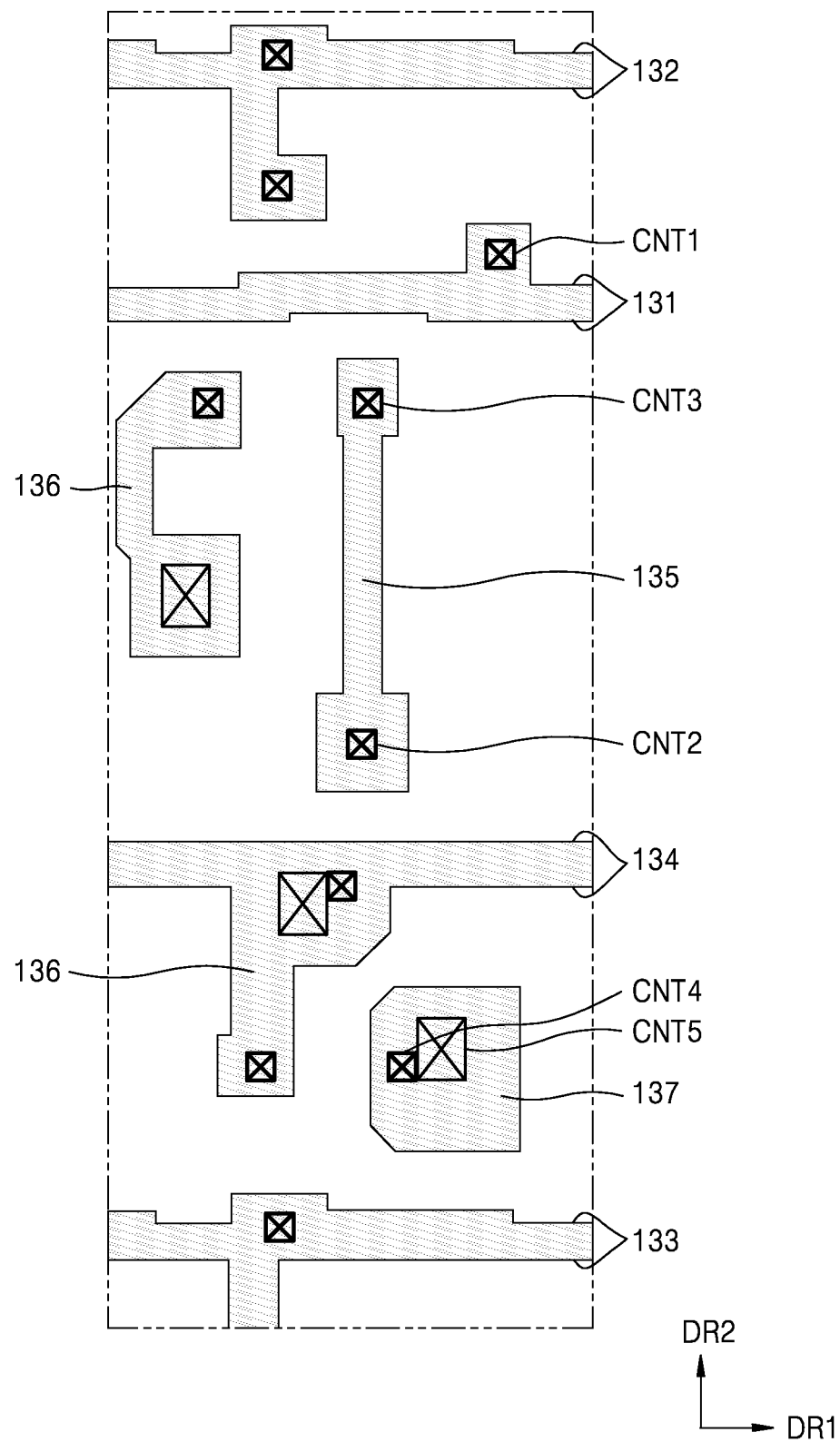
Figure 8:
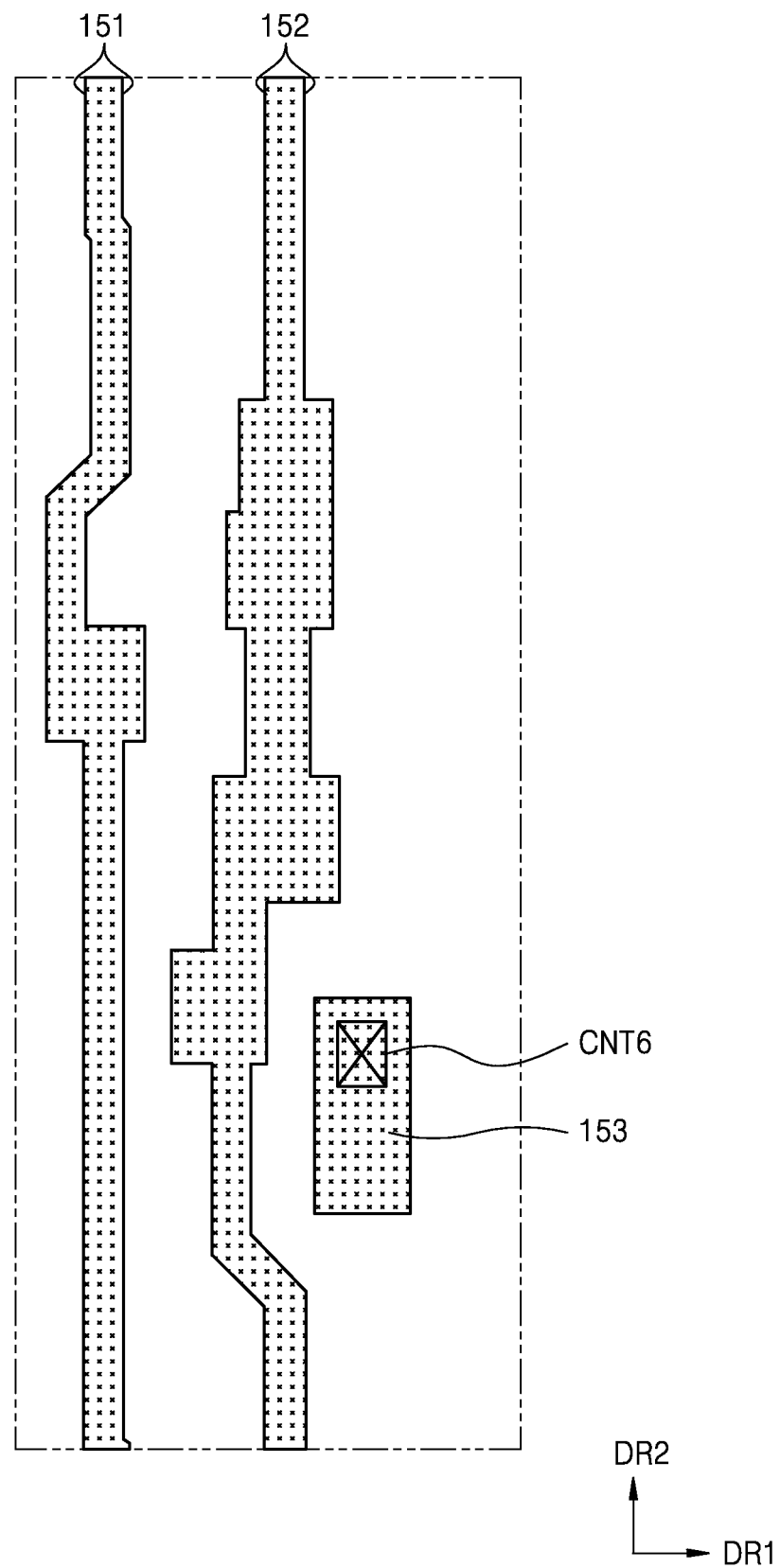

In an embodiment, a first gate insulating layer 112 (see FIG. 9) may be disposed between a layer shown in FIG. 4 and a layer shown in FIG. 5, a second gate insulating layer 113 (see FIG. 9) may be disposed between the layer of FIG. 5 and a layer shown in FIG. 6, an interlayer insulating layer 114 (see FIG. 9) may be disposed between the layer of FIG. 6 and a layer shown in FIG. 7, and a via insulating layer 115 (see FIG. 9) may be disposed between the layer of FIG. 7 and a layer shown in FIG. 8. The above insulating layers include contact holes CNT1, CNT2, CNT3, CNT4, CNT5, and CNT6 to be electrically connected to one another among the layered structures shown in FIGS. 4, 5, 6, 7, and 8.

Hereinafter, structures and arrangement of the thin film transistors T1, T2, T3, T4, T5, T6, and T7 will be described below with reference to FIGS. 3, 4, 5, and 6, and structures and arrangement of the lines 131, 132, 133, 134, 121, 122, 123, 151, and 152, a gate connection line 124, and a node connection line 135 will be described below with reference to FIGS. 3, 4, 5, 6, 7, and 8.

Referring to FIGS. 3, 4, 5, and 6, the display panel 10 may include the driving thin film transistor T1, the switching thin film transistor T2, the compensation thin film transistor T3, the first initialization thin film transistor T4, the operation control thin film transistor T5, the emission control thin film transistor T6, the second initialization thin film transistor T7, the storage capacitor Cap, and an organic light-emitting device (not shown).

A driving semiconductor layer A1 of the driving thin film transistor T1, a switching semiconductor layer A2 of the switching thin film transistor T2, a compensation semiconductor layer A3 of the compensation thin film transistor T3, a first initialization semiconductor layer A4 of the first initialization thin film transistor T4, an operation control semiconductor layer A5 of the operation control thin film transistor T5, an emission control semiconductor layer A6 of the emission control thin film transistor T6, and a second initialization semiconductor layer A7 of the second initialization thin film transistor T7 are disposed on the same layer and may include the same material as one another.

In an example, the semiconductor layers A1, A2, A3, A4, A5, A6, and A7 may include polycrystalline silicon or amorphous silicon. Alternatively, the semiconductor layers A1, A2, A3, A4, A5, A6, and A7 may include an oxide semiconductor material including an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In addition, the semiconductor layers A1, A2, A3, A4, A5, A6, and A7 may be connected to one another and may be variously curved.

Each of the semiconductor layers A1, A2, A3, A4, A5, A6, and A7 may include a channel region, and a source region and a drain region located at opposite sides of the channel region. In an example, the source region and the drain region may be doped with impurities, and the impurities may include N-type impurities or P-type impurities. The source region and the drain region may respectively correspond to a source electrode and a drain electrode of a thin film transistor. Hereinafter, terms such as the source region and the drain region rather than the source electrode and the drain electrode will be used for convenience' sake.

The driving gate electrode G1 of the driving thin film transistor T1, the switching gate electrode G2 of the switching thin film transistor T2, the compensation gate electrode G3 of the compensation thin film transistor T3, the first initialization gate electrode G4 of the first initialization thin film transistor T4, the operation control gate electrode G5 of the operation control thin film transistor T5, the emission control gate electrode G6 of the emission control thin film transistor T6, and the second initialization gate electrode G7 of the second initialization thin film transistor T7 may be disposed on the same layer and may include the same material as one another.

In an example, the gate electrodes G1, G2, G3, G4, G5, G6, and G7 may be disposed on the first gate insulating layer 112 (see FIG. 9), and thus the first gate insulating layer 112 (see FIG. 9) may be disposed between the semiconductor layers A1, A2, A3, A4, A5, A6, and A7 and the gate electrodes G1, G2, G3, G4, G5, G6, and G7.

Each of the gate electrodes G1, G2, G3, G4, G5, G6, and G7 may include molybdenum (Mo) and titanium (Ti) and may include a single-layered structure or a multi-layered structure.

The driving thin film transistor T1 may include the driving semiconductor layer A1 and the driving gate electrode G1. The driving semiconductor layer A1 may be curved. The storage capacitor Cap may be provided on the driving semiconductor layer A1 to overlap the driving thin film transistor T1.

The driving semiconductor layer A1 may include a driving channel region, a driving source region, and a driving drain region at opposite sides of the driving channel region. The driving semiconductor layer A1 has a curved shape and may be longer than the other semiconductor layers A2, A3, A4, A5, A6, and A7. For example, the driving semiconductor layer A1 may be curved several of times to make "Ω" or "S" shape and may form a long channel length within a narrow space. Because the driving semiconductor layer A1 has long channel length, a driving range of a gate voltage applied to the driving gate electrode G1 is large. Thus, grayscale of the light emitted from the organic light-emitting diode OLED may be precisely controlled, and accordingly the display quality may be improved.

An end of the driving semiconductor layer A1 in the driving thin film transistor T1 is connected to the switching semiconductor layer A2 and the operation control semiconductor layer A5, and the other end of the driving semiconductor layer A1 may be connected to the compensation semiconductor layer A3 and the emission control semiconductor layer A6.

The storage capacitor Cap may include a lower electrode Cap1 and an upper electrode Cap2 that are arranged with respect to the second gate insulating layer 113 (see FIG. 9) therebetween. Here, the driving gate electrode G1 may also function as the lower electrode Cap1. That is, the driving gate electrode G1 may be integrally formed with the lower electrode Cap1. The second gate insulating layer 113 (see FIG. 9) may function as a dielectric substance of the storage capacitor Cap, and a storage capacitance may be determined by charges stored in the storage capacitor Cap and a voltage between the lower and upper electrodes Cap1 and Cap2.

The lower electrode Cap1 may be provided as an isolated type electrode. The lower electrode Cap1 may include the same material and may be disposed at the same layer as those of the switching gate electrode G2, the compensation gate electrode G3, the first initialization gate electrode G4, the operation control gate electrode G5, the emission control gate electrode G6, and the second initialization gate electrode G7.

Figure 9:
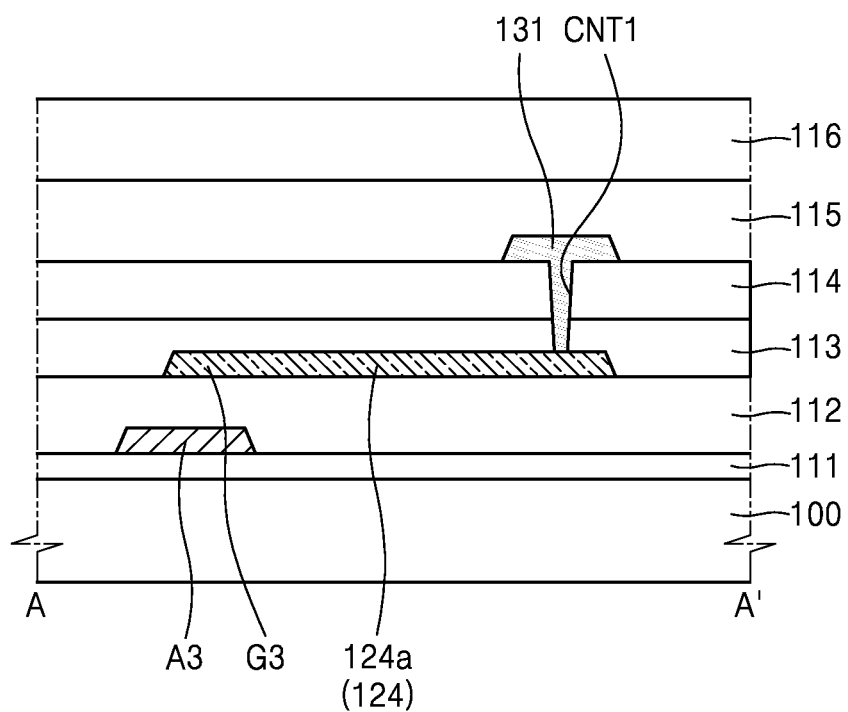
FIG. 9 is a cross-sectional view of the display panel taken along line A-A' of FIG. 3.

The upper electrode Cap2 may be on the second gate insulating layer 113 (see FIG. 9). The upper electrode Cap may entirely overlap the lower electrode Cap1 and may include a storage opening SOP. The storage opening SOP may overlap the lower electrode Cap1. The storage opening SOP may be formed as a single closed curve through the upper electrode Cap2. Here, the single closed curve may denote a closed figure having a starting point and an ending point that are equal to each other (e.g., a polygon or a circle). The upper electrode Cap2 may be connected to the driving voltage line 152 via a contact hole and may receive the driving power voltage ELVDD (see FIG. 2).

The switching thin film transistor T2 may include the switching semiconductor layer A2 and the switching gate electrode G2. The switching semiconductor layer A2 may include a switching source region and a switching drain region located at opposite sides of a switching channel region. Either the switching source region or the switching drain region may be connected to the driving source region or the driving drain region.

The compensation thin film transistor T3 may include the compensation semiconductor layer A3 and the compensation gate electrode G3. The compensation semiconductor layer A3 may include a compensation source region and a compensation drain region located at opposite sides of a compensation channel region. The compensation thin film transistor T3 formed on the compensation semiconductor layer A3 is a dual-thin film transistor including two compensation channel regions. A region between the compensation channel regions is a region doped with impurities and may locally correspond to a source region of one of the dual-thin film transistor and a drain region of the other dual-thin film transistor. The compensation drain region may be connected to the lower electrode Cap1 via the node connection line 135 (see FIG. 7). The compensation gate electrode G3 may form a dual gate electrode to prevent leakage current. The compensation gate electrode G3 may be connected to the switching gate electrode G2.

The first initialization thin film transistor T4 may include the first initialization semiconductor layer A4 and the first initialization gate electrode G4. The first initialization semiconductor layer A4 may include a first initialization source region and a first initialization drain region located at opposite sides of a first initialization channel region. The first initialization thin film transistor T4 formed on the first initialization semiconductor layer A4 is a dual-thin film transistor including two first initialization channel regions. A region between the first initialization channel regions is a region doped with impurities and may locally correspond to a source region of one of the dual-thin film transistor and a drain region of the other dual-thin film transistor. Either the first initialization source region or the first initialization drain region may be connected to the lower electrode Cap1 via the node connection line 135 (see FIG. 7).

The operation control thin film transistor T5 may include the operation control semiconductor layer A5 and the operation control gate electrode G5. The operation control semiconductor layer A5 may include an operation control semiconductor layer and an operation control drain region located at opposite sides of an operation control channel region. Either the operation control source region or the operation control drain region may be connected to the driving source region or the driving drain region, which is connected to the switching thin film transistor T2.

The emission control thin film transistor T6 includes the emission control semiconductor layer A6 and the emission control gate electrode G6. The emission control semiconductor layer A6 may include an emission control source region and an emission control drain region located at opposite sides of an emission control channel region. Either the emission control source region or the emission control drain region may be connected to the driving drain region or the driving source region, which is not connected to the operation control thin film transistor T5.

The second initialization thin film transistor T7 includes the second initialization semiconductor layer A7 and the second initialization gate electrode G7. The second initialization semiconductor layer A7 includes a second initialization source region and a second initialization drain region located at opposite sides of a second initialization channel region. Either the second initialization source region or the second initialization drain region may be connected to the emission control semiconductor layer A6.

Referring to FIGS. 3, 4, 5, 6, 7, and 8, the display panel 10 may include the scan line 131, the previous scan line 132, the next scan line 133, a horizontal driving voltage line 134, the emission control line 121, and the first and second initialization voltage lines 122 and 123 extending in a first direction DR1, and the data line 151 and the driving voltage line 152 extending in a second direction DR2 crossing the first direction DR1. Also, the display panel 10 may include the gate connection line 124 and the node connection line 135.

The first and second initialization voltage lines 122 and 123 may have the same material as that of the semiconductor layers A1, A2, A3, A4, A5, A6, and A7 and may be disposed on the same layer as the semiconductor layers A1, A2, A3, A4, A5, A6, and A7. The first initialization voltage line 122 may be connected to one of the first initialization source region and the first initialization drain region. The second initialization voltage line 123 may be connected to the second initialization drain region or the second initialization source region of the second initialization thin film transistor T7. The first and second initialization voltage lines 122 and 123 may extend in the first direction DR1.

The emission control line 121 may include the same material as that of the gate electrodes G1 to G7 and may be at the same layer as the gate electrodes G1 to G7. The operation control gate electrode G5 and the emission control gate electrode G6 may be parts of the emission control line 121. The emission control line 121 may extend in the first direction DR1.

In an embodiment, the switching gate electrode G2 and the compensation gate electrode G3 may be parts of the gate connection line 124. The gate connection line 124 may include the same material as that of the gate electrodes G1, G2, G3, G4, G5, G6, and G7 and may be disposed on the same layer as the gate electrodes G1, G2, G3, G4, G5, G6, and G7. The gate connection line 124 may include a first portion 124a extending in the second direction DR2 crossing the first direction DR1, and a second portion 124b extending from the first portion 124a in the first direction DR1. The first portion 124a may include a first end portion and a second end portion opposite to each other in the second direction DR2, and the second portion 124b may extend from a portion between the first end portion and the second end portion of the first portion 124a in the first direction DR1. The first end portion of the first portion 124a of the gate connection line 124 may be electrically connected to the scan line 131 that will be described later with reference to FIG. 7.

The scan line 131, the previous scan line 132, the next scan line 133, the horizontal driving voltage line 134, the node connection line 135, the connecting electrode 136, and an intermediate connection layer 137 may include the same material and may be disposed on the same layer as one another.

The scan line 131, the previous scan line 132, and the next scan line 133 may be disposed on different layers from the gate electrodes G1, G2, G3, G4, G5, G6, and G7 of the thin film transistors T1, T2, T3, T4, T5, T6, and T7, and may have a less resistance than those of the gate electrodes G1, G2, G3, G4, G5, G6, and G7. That is, a resistivity of the scan line 131 may be less than those of the gate electrodes G1, G2, G3, G4, G5, G6, and G7. As such, an RC delay according to application of the scan signal may be prevented or reduced.

For example, the scan line 131, the previous scan line 132, and the next scan line 133 may include a conductive material including aluminum (Al), copper (Cu), titanium (Ti), and molybdenum (Mo), and may have a single-layered or multi-layered structure. For example, each of the scan line 131, the previous scan line 132, and the next scan line 133 may have a multi-layered structure including Ti/Al/Ti.

The scan line 131, the previous scan line 132, and the next scan line 133 are disposed on an interlayer insulating layer 114 (see FIG. 9), and the interlayer insulating layer 114 (see FIG. 9) may be between the scan line 131, the previous scan line 132, the next scan line 133, and the upper electrode Cap2. That is, the second gate insulating layer 113 (see FIG. 9) and the interlayer insulating layer 114 (see FIG. 9) may be disposed between the scan line 131 and the gate electrodes G1, G2, G3, G4, G5, G6, and G7. The scan line 131, the previous scan line 132, and the next scan line 133 are disposed on different layer from the gate electrodes G1, G2, G3, G4, G5, G6, and G7 connected thereto. Thus, the scan line 131, the previous scan line 132, and the next scan line 133 may be connected to the gate electrodes G1, G2, G3, G4, G5, G6, and G7 via contact holes.

In an embodiment, the scan line 131 may be electrically connected to the gate connection line 124 via a first contact hole CNT1 in the interlayer insulating layer 114 (see FIG. 9) and the second gate insulating layer 113 (see FIG. 9). The scan line 131 and the gate connection line 124 may have different materials from each other. The gate connection line 124 may be configured to transfer the scan signal transmitted through the scan line 131 to the switching gate electrode G2 and the compensation gate electrode G3.

The horizontal driving voltage line 134 may extend in the first direction DR1. The horizontal driving voltage line 134 may be connected to the driving voltage line 152 extending in the second direction DR2 via a contact hole. Therefore, the horizontal driving voltage line 134 and the driving voltage line 152 may form a mesh structure. The horizontal driving voltage line 134 may be connected to the semiconductor layer A5 and the upper electrode Cap2 of the storage capacitor Cap via the contact hole. Thus, the operation control thin film transistor T5 and the upper electrode Cap2 may receive the driving voltage line ELVDD (see FIG. 2) from the driving voltage line 152 and the horizontal driving voltage line 134.

The node connection line 135 may connect the lower electrode Cap1 of the storage capacitor Cap to the compensation thin film transistor T3 and the first initialization thin film transistor T4. One end portion of the node connection line 135 may be connected to the lower electrode Cap1 via a second contact hole CNT2. The other end portion of the node connection line 135 may be connected to the compensation semiconductor layer A3 and the first initialization semiconductor layer A4 via a third contact hole CNT3.

The connecting electrode 136 may connect the switching semiconductor layer A2 to the data line 151. One end of the connecting electrode 136 is connected to the switching semiconductor layer A2 via a contact hole, and the other end of the connecting electrode 136 may be connected to the data line 151 via a contact hole. The connecting electrode 136 may bypass around the region where the switching gate electrode G2 is arranged so as not to overlap the switching gate electrode G2 on a plane.

The intermediate connection layer 137 may be connected to the emission control semiconductor layer A6 and an auxiliary connection layer 153 (see FIG. 8) via a contact hole. The intermediate connection layer 137 may be electrically connected to the pixel electrode 210 of the organic light-emitting device via the auxiliary connection layer 153 that will be described later.

The data line 151, the driving voltage line 152, and the auxiliary connection layer 153 may include the same material and may be at the same layer.

The data line 151 and the driving voltage line 152 may be arranged with the scan line 131 and a via insulating layer 115 therebetween, and may extend in the second direction DR2 crossing the first direction DR1. The data line 151 and the driving voltage line 152 may have a resistivity value similar to that of the scan line 131. For example, the data line 151 and the driving voltage line 152 may have a conductive material including aluminum (Al), copper (Cu), titanium (Ti), and molybdenum (Mo), and may have a single-layered or multi-layered structure including the above material. The data line 151 and the driving voltage line 152 may have, for example, a multi-layered structure including Ti/Al/Ti.

Figure 10:
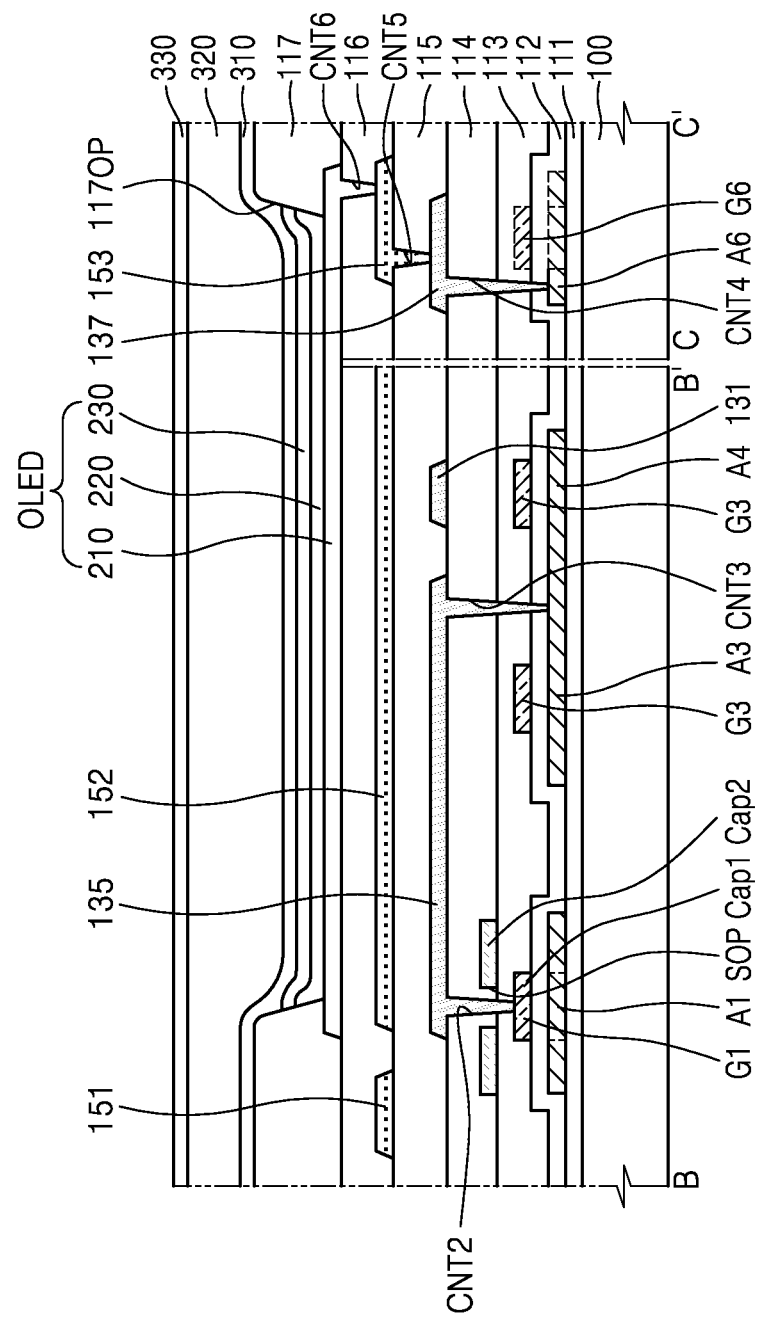
FIG. 10 is a cross-sectional view of the display panel taken along line B-B' and line C-C' of FIG. 3.

The auxiliary connection layer 153 may be electrically connected to the pixel electrode 210 or the organic light-emitting device via a contact hole in the planarization layer 116 (see FIG. 10).

FIG. 9 is a cross-sectional view of the display panel taken along line A-A' of FIG. 3, and FIG. 10 is a cross-sectional view of the display panel taken along line B-B' and C-C' of FIG. 3.

As illustrated with reference to FIGS. 9 and 10, the various components described above may be on the substrate 100. The substrate 100 may include glass or a polymer resin. For example, the substrate 100 may include polyethersulfone, polyacrylate, polyether imide, polyethylene naphthalate, polyethylene terephthalate, polyphenylene sulfide, polyarylate, polyimide, polycarbonate, and cellulose acetate propionate. The substrate 100 including the polymer resin may be flexible, rollable, or bendable. The substrate 100 may have a multi-layered structure including a layer including the polymer resin stated above and an inorganic layer (not shown).

A buffer layer 111 may be on the substrate 100. The buffer layer 111 may reduce or prevent infiltration of impurities, moisture, or external air from below the substrate 100, and may provide a planarized surface on the substrate 100. The buffer layer 111 may include an inorganic insulating material such as silicon oxide, silicon oxynitride, and silicon nitride, and may have a single-layered or multi-layered structure including the stated materials.

The semiconductor layers A1, A2, A3, A4, A5, A6, and A7 and the first and second initialization voltage lines 122 and 123 shown in FIG. 4 may be disposed on the buffer layer 111. The first gate insulating layer 112 may be disposed on the semiconductor layers A1, A2, A3, A4, A5, A6, and A7 and the first and second initialization voltage lines 122 and 123. The first gate insulating layer 112 may include an inorganic insulating material such as silicon oxide, silicon oxynitride, and silicon nitride, and may have a single-layered or multi-layered structure including the stated materials.

The gate electrodes G1 to G7 and the emission control line 121 shown in FIG. 5 may be on the first gate insulating layer 112. The second gate insulating layer 113 may be on the gate electrodes G1, G2, G3, G4, G5, G6, and G7 and the emission control line 121. The second gate insulating layer 113 may include an inorganic insulating material such as silicon oxide, silicon oxynitride, and silicon nitride, and may have a single-layered or multi-layered structure including the stated materials.

The upper electrode Cap2 of the storage capacitor Cap shown in FIG. 6 may be disposed on the second gate insulating layer 113, and the interlayer insulating layer 114 may cover the upper electrode Cap2. The interlayer insulating layer 114 may include an inorganic insulating material such as silicon oxide, silicon oxynitride, and silicon nitride, and may have a single-layered or multi-layered structure including the stated materials.

The scan line 131, the previous scan line 132, the next scan line 133, the horizontal driving voltage line 134, the node connection line 135, the connecting electrode 136, and the intermediate connection layer 137 shown in FIG. 7 may be disposed on the interlayer insulating layer 114. The via insulating layer 115 may be on the scan line 131, the previous scan line 132, the next scan line 133, the horizontal driving voltage line 134, the node connection line 135, the connecting electrode 136, and the intermediate connection layer 137. The via insulating layer 115 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and any mixture of the above. The via insulating layer 115 may include an inorganic material. The via insulating layer 115 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). When the via insulating layer 115 includes the inorganic material, a chemical planarization polishing may be performed. Alternatively, the via insulating layer 115 may include both an organic material and an inorganic material.

The data line 151, the driving voltage line 152, and the auxiliary connection layer 153 may be disposed on the via insulating layer 115, and the planarization layer 116 may be disposed on the data line 151, the driving voltage line 152, and the auxiliary connection layer 153. The planarization layer 116 may include an organic material such as acryl, benzocyclobutene (BCB), polyimide, and hexamethyldisiloxane (HMDSO). Alternatively, the planarization layer 116 may include an inorganic material. The planarization layer 116 may planarize an upper portion of a protective layer covering the thin film transistors T1, T2, T3, T4, T5, T6, and T7. The planarization layer 116 may have a single-layered or multi-layered structure.

A pixel electrode 210 may be disposed on the planarization layer 116. The pixel electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or any compound of the above. The pixel electrode 210 may include a reflective layer having the above-stated material and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide, or aluminum zinc oxide (AZO). In an embodiment, the pixel electrode 210 may have a triple-layered structure including ITO layer/Ag layer/ITO layer that are stacked sequentially.

A pixel defining layer 117 may be disposed on the pixel electrode 210. The pixel defining layer 117 covers edges of the pixel electrode 210 and may include an opening 1170P overlapping a central portion of the pixel electrode 210.

The pixel defining layer 117 increases a distance between an edge of the pixel electrode 210 and the opposite electrode 230 on the pixel electrode 210 to prevent generation of electric spark at the edge of the pixel electrode 210. The pixel defining layer 117 may include an organic insulating material such as polyimide, polyamide, an acrylic resin, benzocyclobutene, hexamethyldisiloxane (HMDSO), and a phenol resin, and may be obtained by a spin coating or any other similar processes.

An intermediate layer 220 is disposed on the pixel defining layer 117 and overlaps the pixel electrode 210. The intermediate layer 220 may include a polymer or low-molecular weight organic material which emits certain color light.

An opposite electrode 230 is disposed on the intermediate layer 220. An opposite electrode 230 may include a conductive material having a relatively low work function. For example, the opposite electrode 230 may include a (semi-)transparent layer including argentum (Ag), magnesium (Mg), aluminum (Al), nickel (Ni), chromium (Cr), lithium (Li), calcium (Ca), or an alloy of the above. Alternatively, the opposite electrode 230 may further include a layer including ITO, IZO, ZnO, or $In_2O_3$ on the (semi-)transparent layer including the above material. In an embodiment, the opposite electrode 230 may include argentum (Ag) and magnesium (Mg). The opposite electrode 230 may be integrally formed to entirely cover the display area DA.

A stack structure of the pixel electrode 210, the intermediate layer 220, and the opposite electrode 230 that are sequentially stacked may configure a light-emitting diode such as organic light-emitting diode OLED. The organic light-emitting diode OLED may emit red light, green light, or blue light, and an emission area in each organic light-emitting diode OLED may correspond to the pixel PX.

A thin film encapsulation layer 300 may be disposed on the opposite electrode 230. The organic light-emitting diode OLED may be covered by the thin film encapsulation layer 300. The thin film encapsulation layer 300 may include first and second inorganic encapsulation layers 310 and 330, and an organic encapsulation layer 320 disposed between the first encapsulation layer 310 and second inorganic encapsulation layer 330.

Each of the first and second inorganic encapsulation layers 310 and 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be obtained by a chemical vapor deposition method.

The organic encapsulation layer 320 may include a polymer-based material. The polymer-based material may include an acryl-based resin, an epoxy-based resin, polyimide, and polyethylene. For example, the organic encapsulation layer 320 may include an acryl-based resin such as polymethylmethacrylate and polyacrylic acid. The organic encapsulation layer 320 may be obtained by curing a monomer or applying polymer.

Referring to FIG. 9, the first portion 124a of the gate connection line 124 may be integrally provided with the compensation gate electrode G3. The second end of the first portion 124a may overlap the compensation semiconductor layer A3 arranged thereunder. The first end of the first portion 124a may be electrically connected to the scan line 131 arranged thereon, via the first contact hole CNT1 in the second gate insulating layer 113 and the interlayer insulating layer 114. The compensation thin film transistor T3 may be apart from the scan line 131 on a plane by using the gate connection line 124. Accordingly, the compensation semiconductor layer A3 may be disposed closer to the driving semiconductor layer A1 than the scan line 131 on a plane as described later with reference to FIG. 11.

Referring to the cross-section taken along line B-B' of FIG. 10, the first end of the node connection line 135 is connected to the lower electrode Cap1 via the second contact hole CNT2 in the second gate insulating layer 113 and the interlayer insulating layer 114. Here, the second contact hole CNT2 is in the storage opening SOP of the upper electrode Cap2. The storage opening SOP has a size greater than that of the second contact hole CNT2 such that the second contact hole CNT2 may be connected to the lower electrode Cap1 without contacting the upper electrode Cap2. The second end of the node connection line 135 may be connected with the compensation semiconductor layer A3 and the first initialization semiconductor layer A4 via the third contact hole CNT3 in the first gate insulating layer 112, the second gate insulating layer 113, and the interlayer insulating layer 114.

Referring to the cross-section taken along line C-C' of FIG. 10, the intermediate connection layer 137 on the interlayer insulating layer 114 may be connected to the emission control semiconductor layer A6 of the emission control thin film transistor T6 via a fourth contact hole CNT4 in the interlayer insulating layer 114, the second gate insulating layer 113, and the first gate insulating layer 112. Here, a part of the emission control semiconductor layer A6 where line C-C' does not pass through is represented by a dotted line. The auxiliary connection layer 153 on the via insulating layer 115 may be connected to the intermediate connection layer 137 via a fifth contact hole CNT5 in the via insulating layer 115. The pixel electrode 210 on the planarization layer 116 may be connected to the auxiliary connection layer 153 via a sixth contact hole CNT6 in the planarization layer 116. Therefore, the emission control semiconductor layer A6 of the emission control thin film transistor T6 may be electrically connected to the pixel electrode 210 of the organic light-emitting diode OLED.

Figure 11:
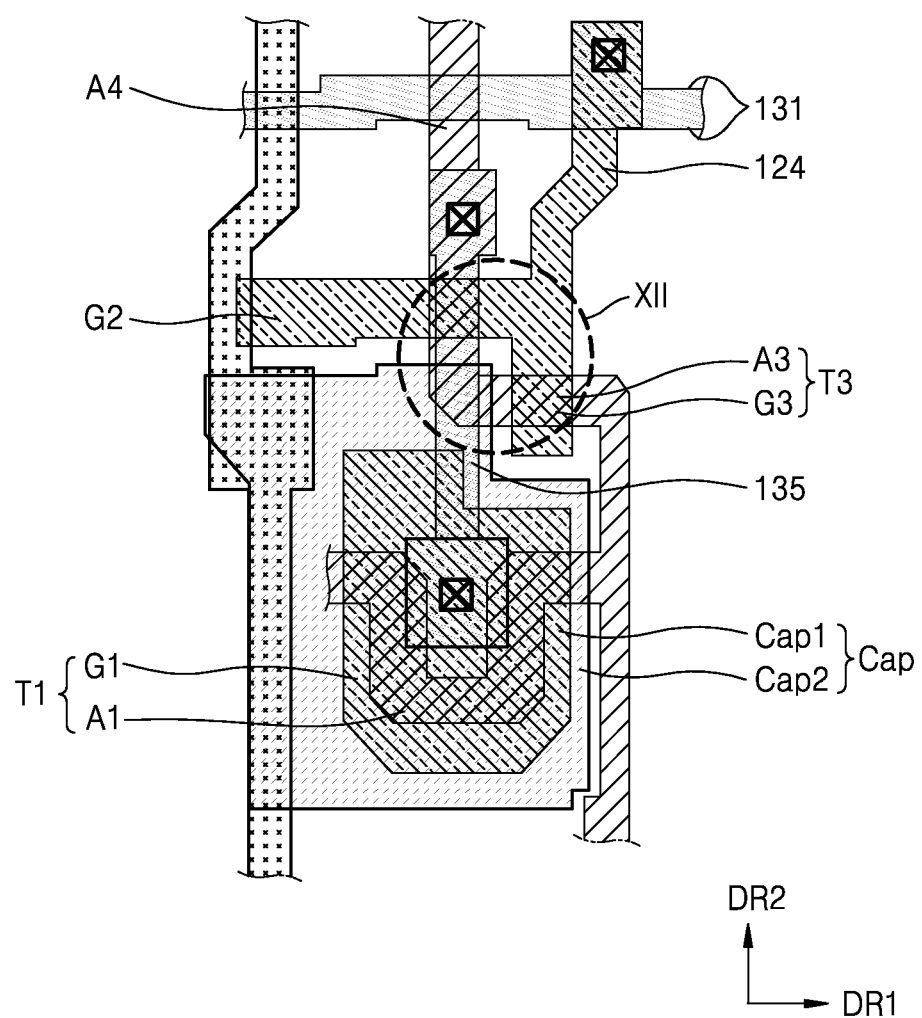
FIG. 11 is an arrangement diagram showing some components including a gate connection line and a node connection line extracted from the components shown in FIG. 3.
Figure 12A:
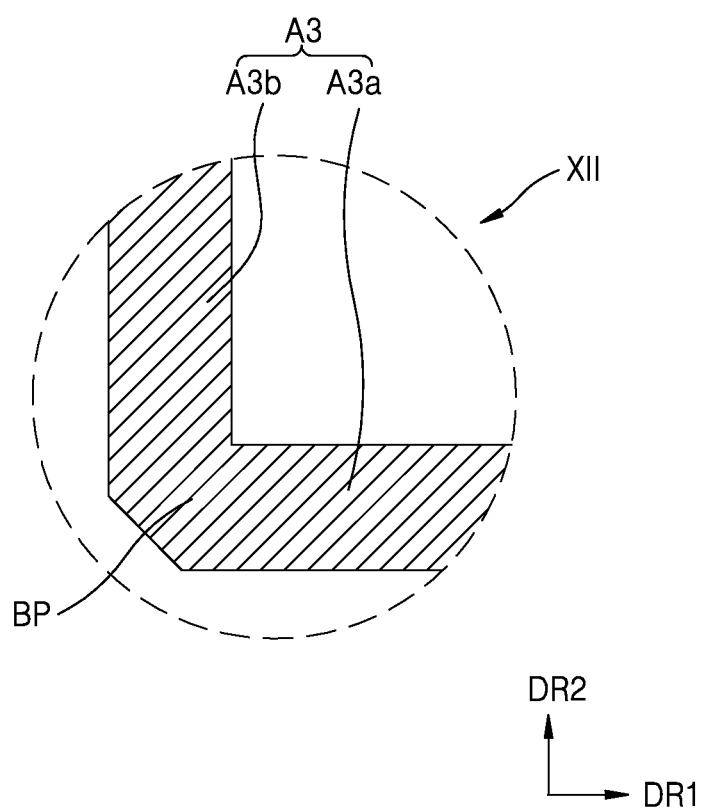
FIGS. 12A, 12B, and 12C are enlarged top plan views showing a region XII of FIG. 11.
Figure 12B:
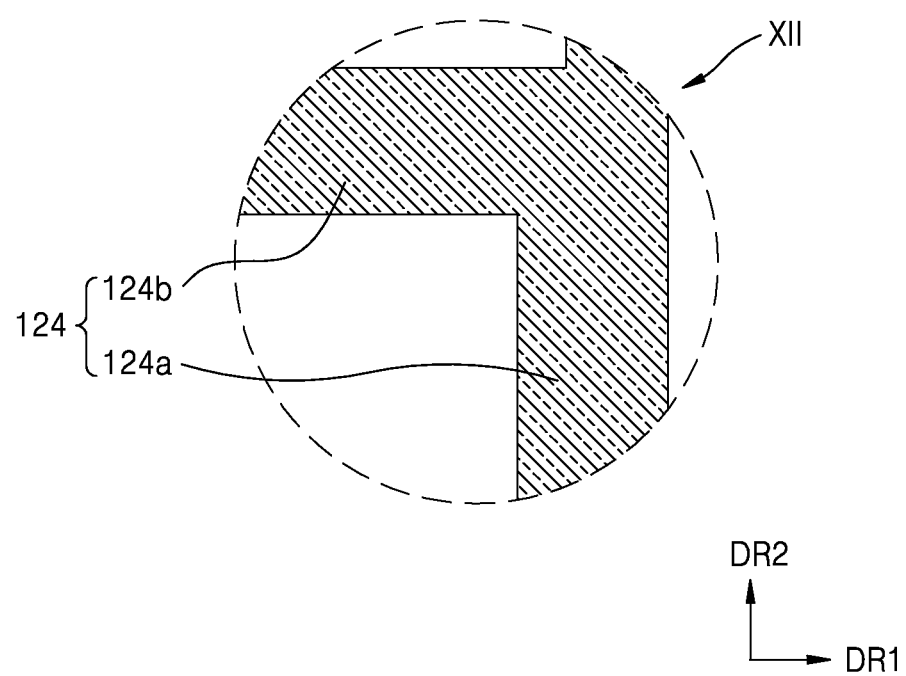
Figure 12C:
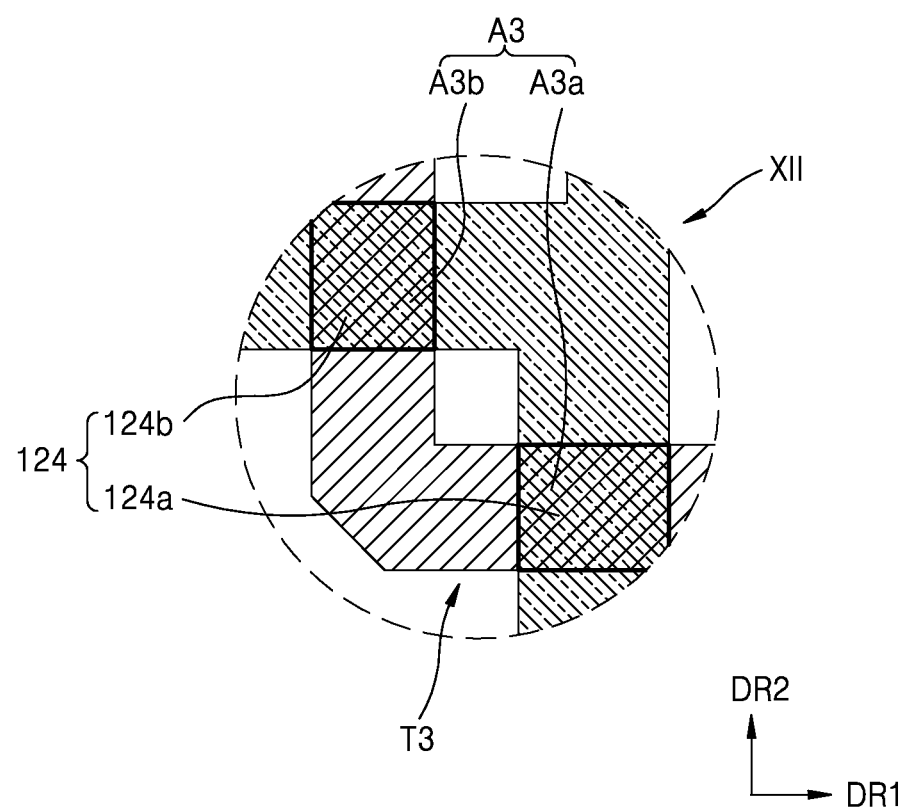

FIG. 11 is an arrangement diagram showing some extracted components based on the gate connection line 124 and the node connection line 135 from the components shown in FIG. 3. FIGS. 12A, 12B, and 12C are enlarged top plan views showing portion XII of FIG. 11.

FIG. 11 shows some arrangements of the driving semiconductor layer A1 and the driving gate electrode G1 of the driving thin film transistor T1, the lower electrode Cap1 and the upper electrode Cap2 of the storage capacitor Cap, the switching gate electrode G2 of the switching thin film transistor T2, the compensation semiconductor layer A3 of the compensation gate electrode G3 of the compensation thin film transistor T3, the first initialization semiconductor layer A4 of the first initialization thin film transistor T4, the gate connection line 124, the node connection line 135, the scan line 131, and the data line 151. In FIG. 11, portion XII shows a region where the compensation semiconductor layer A3 and the compensation gate electrode G3 overlap each other to form the compensation thin film transistor T3, and this will be described below with references to FIGS. 12A, 12B, and 12C.

Referring to FIG. 12A, the compensation semiconductor layer A3 may include a first portion A3*a* and a second portion A3*b* extending in different directions from each other based on a bending point BP. That is, the compensation semiconductor layer A3 may include the first portion A3*a* extending in the first direction DR1, and the second portion A3*b* bent from the first portion A3*a* and extending in the second direction DR2 away from the driving thin film transistor T1.

Referring to FIG. 12B, the gate connection line 124 may include the first portion 124*a* extending in the second direction DR2 crossing the first direction DR1, and the second portion 124*b* extending from the first portion 124*a* in the first direction DR1. A part of the first portion 124*a* is the compensation gate electrode G3 (see FIG. 11), and a part of the second portion 124*b* may be the switching gate electrode G2 (see FIG. 11).

Referring to FIG. 12C, the first portion A3*a* of the compensation semiconductor layer A3 overlaps the first portion 124*a* of the gate connection line 124, and the second portion A3*b* of the compensation semiconductor layer A3 overlaps the second portion 124*b* of the gate connection line 124 to configure the compensation thin film transistor T3.

The gate connection layer 124 and the compensation semiconductor layer A3 overlapping each other may form a square closed loop on a plane including the first direction DR1 and the second direction DR2. Here, the square may include various shapes such as a square shape, a rectangular shape, a rhombus shape, and a trapezoidal shape.

Referring back to FIG. 11, the first portion 124*a* of the gate connection line 124 extends in the second direction DR2 away from the scan line 131, and a part of the first portion 124*a* is the compensation gate electrode G3 of the compensation thin film transistor T3. Thus, the compensation thin film transistor T3 may be disposed closer to the driving thin film transistor T1 than the scan line 131 on a plane.

Also, the node connection line 135 may extend in the second direction DR2 to cross the second portion 124*b* of the gate connection line 124.

As a comparative example, when the gate connection line 124 and the node connection line 135 described above are not provided, the compensation semiconductor layer A3 of the compensation thin film transistor T3 includes an extension portion towards the driving thin film transistor T1 in order to be connected to the driving gate electrode G1 of the driving thin film transistor T1. A parasitic capacitance may occur between the extension portion of the semiconductor layer and the data line 151, and characteristics of the driving thin film transistor T1 may vary depending on the signal supply of the data line 151.

However, one or more embodiments include the gate connection line 124 and the node connection line 135 as described above, and thus, the compensation thin film transistor T3 may be disposed closer to the driving thin film transistor T1 than the scan line 131 on a plane, and the parasitic capacitance that may occur between the data line 151 and the semiconductor layers A1, A2, A3, A4, A5, A6, and A7. Thus, a crosstalk effect caused by the parasitic capacitance may be reduced. As such, a display panel capable of realizing high quality images may be provided.

Also, according to the embodiment, the extension portion of the semiconductor layer in the comparative example and an additional element for preventing the parasitic capacitance may not be necessary, the pixel circuit PC may be densely arranged, and accordingly, the display panel may realize high resolution images.

According to an embodiment, the gate connection line that is electrically connected to the scan line and includes the compensation gate electrode and the switching gate electrode, and the node connection line that electrically connects the driving gate electrode to the compensation semiconductor layer and crosses the gate connection line on a plane are provided, and thus, the parasitic capacitance that may occur between the data line and the semiconductor layer and the crosstalk that may be caused by the parasitic capacitance may be reduced. Also, the scan line having the resistance smaller than that of the switching gate electrode is used, and thus, the RC delay may be prevented. As such, a display panel capable of realizing high quality and high resolution images may be provided. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate;
   a driving thin film transistor disposed on the substrate, the driving thin film transistor including a driving semiconductor layer and a driving gate electrode;
   a compensation thin film transistor disposed on the substrate, the compensation thin film transistor including a compensation semiconductor layer and a compensation gate electrode;
   a node connection line electrically connecting the driving thin film transistor to the compensation thin film transistor;
   a scan line extending in a first direction on the substrate; and
   a gate connection line electrically connected to the scan line, the gate connection line including the compensation gate electrode,
   wherein the compensation semiconductor layer is disposed closer to the driving semiconductor layer than the scan line when viewed on a plane.

2. The display panel of claim 1, further comprising a switching thin film transistor disposed on the substrate, the switching thin film transistor including a switching semiconductor layer and a switching gate electrode,
   wherein the gate connection line further includes the switching gate electrode.

3. The display panel of claim 1, wherein a resistivity value of the scan line is less than a resistivity value of the driving gate electrode.

4. The display panel of claim 1, further comprising an insulating layer disposed between the gate connection line and the scan line,
   wherein the scan line is connected to the gate connection line via a contact hole in the insulating layer.

5. The display panel of claim 1, wherein the gate connection line and the scan line include different materials from each other.

6. The display panel of claim 1, wherein the gate connection line comprises:
a first portion extending in a second direction that crosses the first direction; and
a second portion extending from the first portion in the first direction.

7. The display panel of claim 6, wherein the compensation semiconductor layer includes a first portion and a second portion which extend in different directions from each other from a bending point,
the first portion of the compensation semiconductor layer overlaps the first portion of the gate connection line, and
the second portion of the compensation semiconductor layer overlaps the second portion of the gate connection line.

8. The display panel of claim 7, wherein the gate connection line and the compensation semiconductor layer overlapping each other make a square closed loop when viewed on a plane.

9. The display panel of claim 1, wherein the node connection line extends in the second direction crossing the first direction, and crosses the second portion of the gate connection line.

10. The display panel of claim 1, wherein the driving semiconductor layer is curved.

11. A display panel comprising:
a scan line extending in a first direction;
a data line extending in a second direction that crosses the first direction;
a switching thin film transistor electrically connected to the scan line and the data line, the switching thin film transistor including a switching semiconductor layer and a switching gate electrode;
a driving thin film transistor electrically connected to the switching thin film transistor, the driving thin film transistor including a driving semiconductor layer and a driving gate electrode;
a compensation thin film transistor including a compensation semiconductor layer and a compensation gate electrode that are arranged with respect to a first gate insulating layer therebetween; and
a gate connection line electrically connected to the scan line, the gate connection line including the compensation gate electrode,
wherein the compensation semiconductor layer comprises:
a first portion extending in the first direction, and a second portion bent from the first portion and extending in the second direction away from the driving thin film transistor.

12. The display panel of claim 11, wherein the compensation semiconductor layer is closer to the driving semiconductor layer than the scan line when viewed on a plane.

13. The display panel of claim 11, wherein the gate connection line further includes a first portion extending in the second direction and a second portion extending in the first direction,
the first portion of the gate connection line overlaps the first portion of the compensation semiconductor layer, and
the second portion of the gate connection line overlaps the second portion of the compensation semiconductor layer.

14. The display panel of claim 11, wherein the gate connection line further includes the switching gate electrode.

15. The display panel of claim 11, further comprising a second gate insulating layer and an interlayer insulating layer disposed between the gate connection line and the scan line, and
the scan line is connected to the gate connection line via a first contact hole penetrating through the interlayer insulating layer and the second gate insulating layer.

16. The display panel of claim 11, wherein the gate connection line includes a material different from a material in the scan line.

17. The display panel of claim 11, further comprising:
a second gate insulating layer and an interlayer insulating layer disposed between the gate connection line and the scan line; and
a node connection line electrically connecting the driving thin film transistor to the compensation thin film transistor,
wherein one end portion of the node connection line is connected to the driving gate electrode via a second contact hole penetrating through the interlayer insulating layer and the second gate insulating layer, and
the other end portion of the node connection line is connected to the compensation semiconductor layer via a third contact hole penetrating through the interlayer insulating layer, the second gate insulating layer, and the first gate insulating layer.

18. The display device of claim 17, wherein the node connection line extends in the second direction and crosses the second portion of the gate connection line.

19. The display device of claim 17, wherein the node connection line includes a same material as the scan line.

20. The display panel of claim 11, further comprising:
an emission control thin film transistor electrically connected to the driving thin film transistor, the emission control thin film transistor including an emission control semiconductor layer and an emission control gate electrode; and
an organic light-emitting diode electrically connected to the emission control thin film transistor.

* * * * *